(12) United States Patent
Zheng et al.

(10) Patent No.: US 9,520,431 B2
(45) Date of Patent: Dec. 13, 2016

(54) SELF-ALIGNED ISOLATION STRUCTURES AND LIGHT FILTERS

(71) Applicant: OMNIVISION TECHNOLOGIES, INC., Santa Clara, CA (US)

(72) Inventors: Wei Zheng, Los Gatos, CA (US); Chia-Ying Liu, Hsinchu (TW); Chun-Yung Ai, Taipei (TW); Wu-Zang Yang, Shi-Hu Town (TW); Chih-Wei Hsiung, San Jose, CA (US); Chen-Wei Lu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 85 days.

(21) Appl. No.: 14/505,923

(22) Filed: Oct. 3, 2014

(65) Prior Publication Data

US 2016/0099266 A1 Apr. 7, 2016

(51) Int. Cl.
*H01L 27/00* (2006.01)
*H01L 27/146* (2006.01)

(52) U.S. Cl.
CPC ....... *H01L 27/1463* (2013.01); *H01L 27/1462* (2013.01); *H01L 27/14621* (2013.01); *H01L 27/14623* (2013.01); *H01L 27/14627* (2013.01); *H01L 27/14645* (2013.01); *H01L 27/14685* (2013.01)

(58) Field of Classification Search
CPC ........... H01L 27/1463; H01L 27/14621; H01L 27/1462; H01L 27/14623; H01L 27/14685; H01L 27/14627; H01L 27/14645
See application file for complete search history.

(56) References Cited

U.S. PATENT DOCUMENTS

| 8,502,130 B2* | 8/2013 | Tay | ................. | H01L 27/14621 250/208.1 |
|---|---|---|---|---|
| 2014/0065756 A1* | 3/2014 | Hsu | ................. | H01L 27/14623 438/65 |

OTHER PUBLICATIONS

TW Patent Application No. 104132614—Taiwanese Office Action and Search Report, issued Jul. 7, 2016, with English Translation, 14 pages.

* cited by examiner

*Primary Examiner* — Tony Ko
(74) *Attorney, Agent, or Firm* — Blakely Sokoloff Taylor & Zafman LLP

(57) ABSTRACT

An image sensor includes a semiconductor layer with a plurality of photodiodes. A plurality of isolation structures is disposed in the back side of the semiconductor layer between individual photodiodes in the plurality of photodiodes. The plurality of isolation structures extend into the back side of the semiconductor layer a first depth and extend out of the back side of the semiconductor layer a first length. A plurality of light filters is disposed proximate to the back side of the semiconductor layer such that the plurality of isolation structures is disposed between individual light filters in the plurality of light filters. An antireflection coating is also disposed between the semiconductor layer and the plurality of light filters.

21 Claims, 5 Drawing Sheets

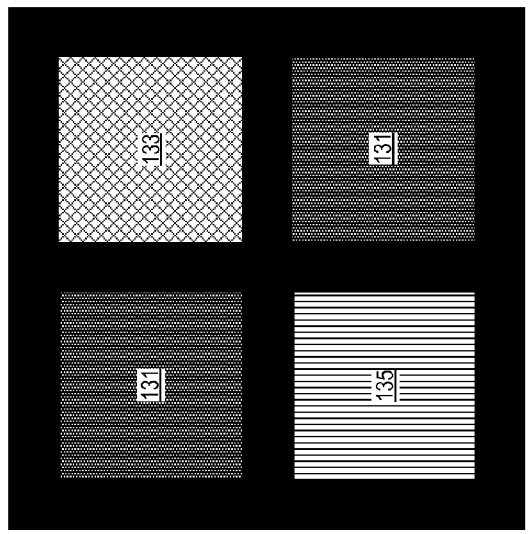
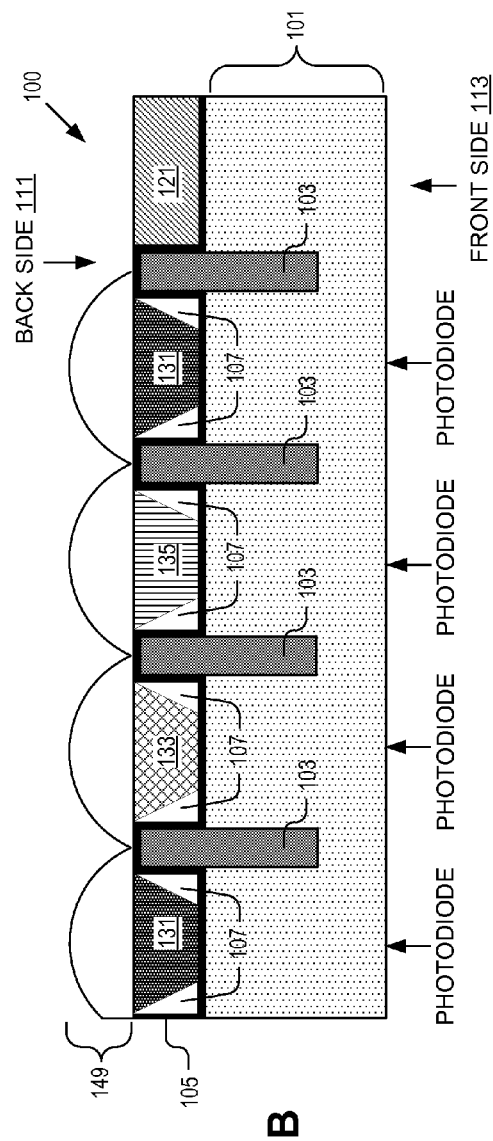
FIG. 1A
FIG. 1B

SELF-ALIGNED ISOLATION STRUCTURES AND LIGHT FILTERS

TECHNICAL FIELD

This disclosure relates generally to image sensors, and in particular but not exclusively, relates to self-aligned isolation structures and light filters in image sensors.

BACKGROUND INFORMATION

Image sensors have become ubiquitous. They are widely used in digital still cameras, cellular phones, security cameras, as well as, medical, automobile, and other applications. The technology used to manufacture image sensors, has continued to advance at a great pace. For example, the demands of higher resolution and lower power consumption have encouraged the further miniaturization and integration of these image sensors.

Pixel crosstalk is a limiting factor in the performance of semiconductor based devices. Ideally each pixel in an image sensor operates as an independent photon detector. In other words, electron/hole content in one pixel does not affect neighboring pixels (or any other pixels in the device). In real image sensors, this is not the case. Electrical signals couple to each other, and charge may spill from one pixel to another. This crosstalk may degrade image resolution, reduce image sensor sensitivity, and cause color-signal mixing.

Similarly, a large distance between color filters and photodiodes may result in low quantum efficiency. In this situation, photons incident on the image sensor may not be converted into usable charge due to the greater opportunity for scattering/reflection/absorption in the intervening layers of device architecture. As a result, lower quality images may be output from the image sensor.

Accordingly, many methods to reduce the effects of pixel crosstalk have been employed, including using heavily doped regions to isolate individual pixels and utilizing post-acquisition algorithms to reduce image noise. However, cross talk persists as problem in semiconductor based image sensors. Likewise, many techniques have been used to improve quantum efficiency in image sensors; however, image sensor device architecture can still be improved upon to enhance the number of photons absorbed by the photodiodes.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIGS. 1A-1B show, respectively, a top-down view of part of an example image sensor including four image sensor pixels, and a cross-sectional view of part of an example image sensor including four image sensor pixels, in accordance with the teachings of the present invention.

DETAILED DESCRIPTION

Figure 2:
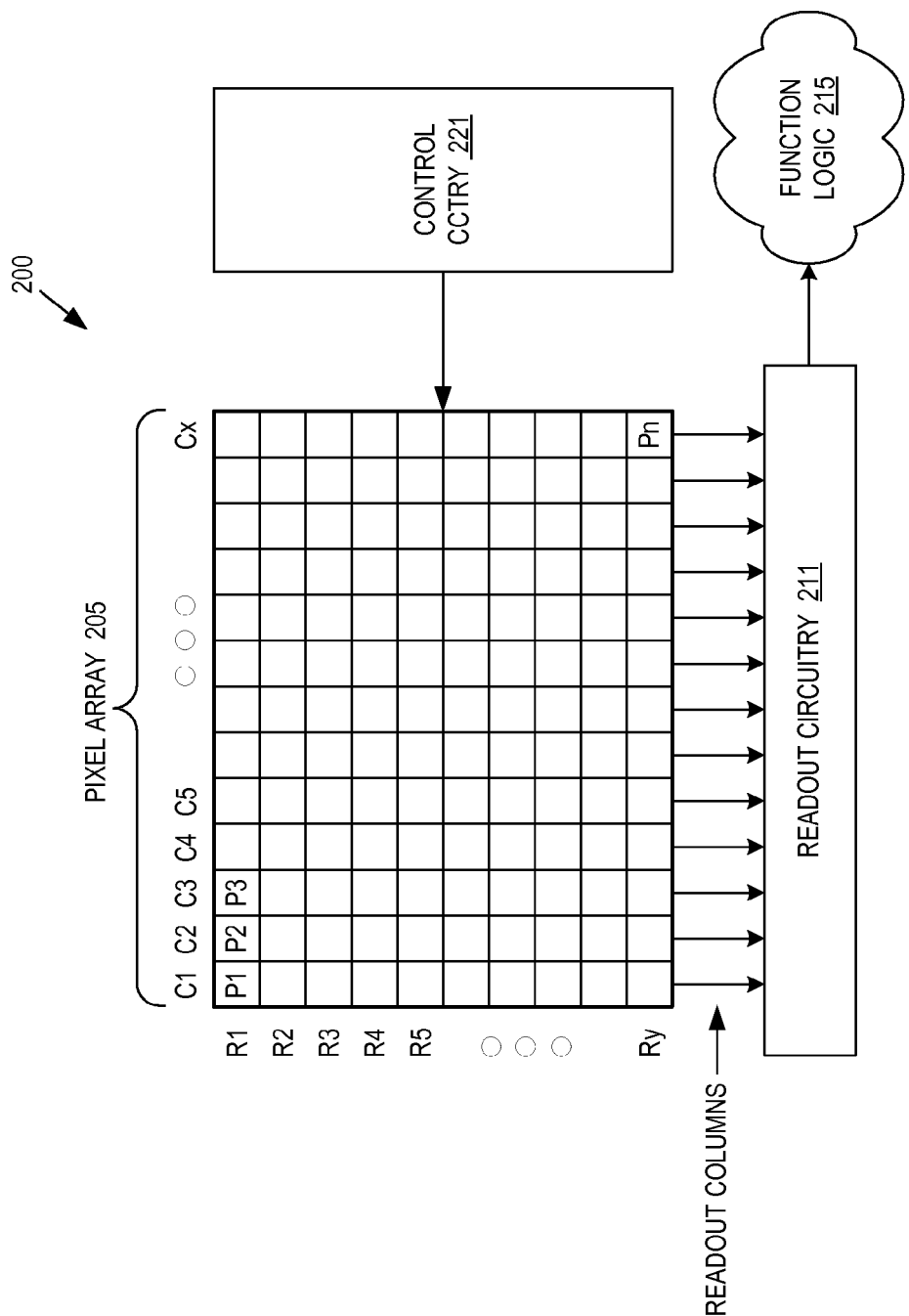
FIG. 2 is a block diagram illustrating one example of an imaging system, in accordance with the teachings of the present invention.

Examples of a system and method for self-aligned isolation structures and light filters are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "an example" means that a particular feature, structure, or characteristic described in connection with the example is included in at least one example of the present invention. Thus, the appearances of the phrases "in one example" or "in an example" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIGS. 1A-1B show, respectively, a top-down view of part of an example image sensor 100 including four image sensor pixels, and a cross-sectional view of part of an example image sensor 100 including four image sensor pixels, in accordance with the teachings of the present invention. As depicted for example in FIG. 1A, a plurality of light filters is shown including green light filter 131, red light filter 133, and blue light filter 135. However, in a different example, clear light filters, or infrared light filters may also be present in image sensor 100. The individual image sensor pixels depicted may include at least one photodiode located underneath a light filter. Additionally, antireflection coating 105 is disposed on a plurality of isolation structures 103 which separates the plurality of light filters/photodiodes. The plurality of isolation structures 103 can act as a method of self-alignment when fabricating the plurality of light filters. However, in a different example, the plurality of light filters may cover the plurality of isolation structures 103 and/or the antireflection coating 105 in part or in whole.

It is worth noting that, the plurality of isolation structures 103 may be of a different geometry than the square pattern depicted. In another example, the plurality of isolation structures 103 may have a honeycomb (hexagonal) lattice. However, one skilled in the relevant art will understand that the plurality of isolation structures 103 may take on any shape (or series of shapes) which permits a repeating lattice (e.g. any plane symmetry group).

The example depicted in FIG. 1B illustrates that image sensor 100 includes a semiconductor layer 101, a plurality of isolation structures 103, an antireflection coating 105, and a plurality of light filters (including green light filters 131, red light filters 133, and blue light filters 135).

Semiconductor layer 101 has a front side 113 and a back side 111, as well as a plurality of photodiodes disposed inside it. A plurality of isolation structures 103 is disposed in the back side 111 of semiconductor layer 101 between individual photodiodes in the plurality of photodiodes. The isolation structures 103 extend into back side 111 of semiconductor layer 101 a first depth and extend out of the back side 111 of semiconductor layer 101 a first length. In one example, the plurality of isolation structures 103 includes at least one of metal, metal oxide, semiconductor, semiconductor oxide, semiconductor nitride, or semiconductor oxynitride. For instance, the plurality of isolation structures 103 may include silicon oxide, silicon nitride, hafnium oxide, platinum, or the like.

The plurality of light filters is disposed proximate to back side 111 of semiconductor layer 101, and the isolation structures 103 are disposed between individual light filters (e.g. green light filter 131, red light filter 133, and blue light filter 135) in the plurality of light filters. In one example, the light filters may include red light filters 133, blue light filters 135, and green light filters 131. However, in another or the same example, the light filters may also include clear light filters and infrared light filters. The light filters may be arranged into a Bayer Pattern, X-Trans Pattern, EXR Pattern, or the like. Additionally, image sensor 100 should not just be limited to the capture of visible light, image sensor 100 may also capture infrared or ultraviolet light depending on the doping schemes of the photodiodes and the presence of other pieces of device architecture not depicted.

Antireflection coating 105 is disposed between semiconductor layer 101 and the plurality of light filters. However, in one example, antireflection coating 105 is also disposed between the plurality of isolation structures 103 and the plurality of light filters. Antireflection coating 105 may include a polymer, metal oxide, or metal halide (e.g. $MgF_2$).

In one example, an interlayer 107 is disposed between the plurality of isolation structures 103 and the plurality of light filters, wherein interlayer 107 is shaped to direct light into the plurality of photodiodes. In another or the same example, interlayer 107 has an increasing width in a direction toward semiconductor layer 101.

In one example, a microlens layer 149 is disposed proximate to the plurality of light filters, wherein the plurality of light filters is disposed between semiconductor layer 101 and microlens layer 149. The microlens layer may be fabricated from a photo-active polymer that is patterned on the surface of the plurality of light filters. Once rectangular blocks of polymer are patterned on the surface of the plurality of light filters, the blocks may be melted (or reflowed) to form the dome-like structure characteristic of microlenses.

During operation, light incident on example image sensor 100 travels through microlens layer 149, the plurality of light filters (including green light filters 131, red light filters 133, and blue light filters 135), antireflection coating 105, and is absorbed by the plurality of photodiodes in semiconductor layer 101. In the same or a different example, however, light with an oblique angle to image sensor 100, may be directed off of interlayer 107, through antireflection coating 105, and into semiconductor layer 101 where it is absorbed by the plurality of photodiodes. Light absorbed by the plurality of photodiodes may be converted into measurable electric charge by virtue of the p-n junction in each photodiode. Accumulated charge may then be transferred out of the plurality of photodiodes by applying a voltage to a transfer gate (not shown) which will allow the accumulated charges to move to a floating diffusion (not shown). In one example, each photodiode in the plurality of photodiodes may have its own transfer gate and floating diffusion. However, in a different example, multiple photodiodes may share a single floating diffusion. In this case, charge may be read out of photodiodes one at a time, by applying a voltage to each photodiode's transfer gate individually, or charge may be read out of multiple photodiodes at the same time by applying a voltage to multiple transfer gates simultaneously.

It is appreciated that isolating individual photodiodes from one another using filled-trench isolation results in decreased pixel crosstalk, as the filled trenches prevent charge from migrating between pixels. Additionally, by placing light filters closer to the photodiodes in an image sensor, higher quantum efficiency can be realized, as photons are more likely to be received by their respective photodiode without being reflected/absorbed by intervening layers of device architecture. Here, the plurality of isolation structures 103 is disposed between individual photodiodes, thus acting as a barrier to prevent charge transfer within the plurality of photodiodes. Additionally, isolation structures 103 extend out of the back side 111 of semiconductor layer 101 and work to self-align the plurality of light filters with the plurality of photodiodes. Not only does this simplify processing of the light filters, but also allows for the light filters to be placed closer to semiconductor layer 101. Fabricating the light filters in this manner enhances quantum efficiency of image sensor 100. Furthermore, performance of image sensor 100 is also enhanced through integration of interlayer 107. Since interlayer 107 directs photons—that otherwise may have been reflected/absorbed by intervening layers of device architecture—into the plurality of photodiodes, quantum efficiency of image sensor 100 may be increased.

FIG. 2 is a block diagram illustrating one example of an imaging system 200, in accordance with the teachings of the present invention. Imaging system 200 includes a pixel array 205 (including the plurality of photodiodes arranged into an array with rows and columns), control circuitry 221, readout circuitry 211, and function logic 215.

Pixel array 205 may be a two-dimensional (2D) array of pixels (e.g., pixels P1, P2 . . . , Pn). In one example, each pixel in pixel array 205 includes a single photodiode from the plurality of photodiodes in FIGS. 1A-1B. In another example, image sensor 100 is included in an imaging system 200. As illustrated, the pixels are arranged into rows (e.g., rows R1 to Ry) and columns (e.g., column C1 to Cx) to acquire image data of a person, place, object, etc., which can then be used to render a 2D image of the person, place, object, etc.

In one example, after each image sensor pixel in pixel array 205 has acquired its image data or image charge, the image charge is readout by readout circuitry 211 and then transferred to function logic 215. Readout circuitry 211 may be coupled to receive image charge from the plurality of photodiodes in pixel array 205. In various examples, readout circuitry 211 may include amplification circuitry, analog-to-digital (ADC) conversion circuitry, or otherwise. Function logic 215 is coupled to readout circuitry 211 and may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 may be configured to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, one or more light shield layers (e.g. light shield layer 121 of FIG. 1B) may be disposed to prevent photons incident on imaging system 205 from reaching the control circuitry 221 and readout circuitry 211. The light shield layer 121 may be an opaque material such as a metal, or the like.

In one example, image sensor 200 may be included in a digital camera, cell phone, laptop computer, or the like. Additionally, image sensor 200 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor 200, extract image data from image sensor 200, or manipulate image data supplied by image sensor 200.

Figure 3:
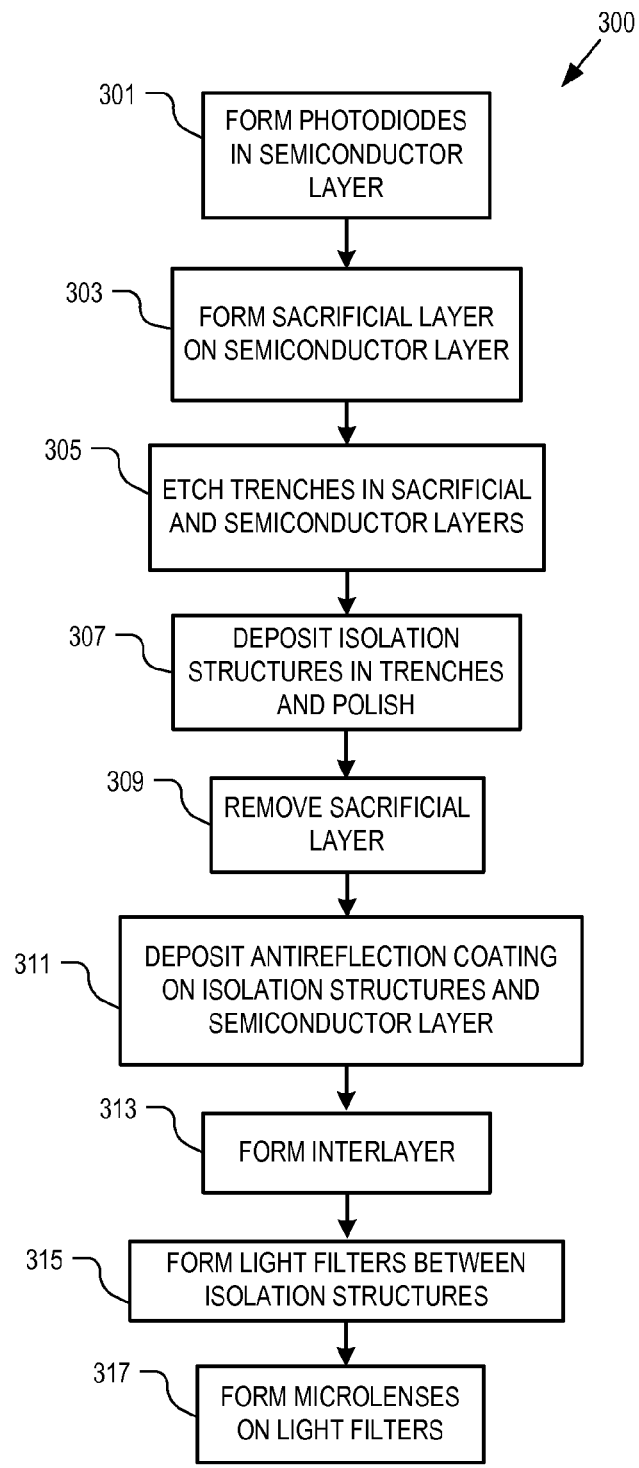
FIG. 3 is a flowchart of one example of a process for forming an image sensor, in accordance with the teachings of the present invention.

FIG. 3 is a flowchart 300 of one example of a process for forming an image sensor (e.g. image sensor 100), in accordance with the teachings of the present invention. The order in which some or all of the process blocks appear in process 300 should not be deemed limiting. Rather, one of ordinary skill in the art having the benefit of the present disclosure will understand that some of the process blocks may be executed in a variety of orders not illustrated, or even in parallel.

Process block 301 shows forming a plurality of photodiodes in a semiconductor layer (e.g. semiconductor layer 101). In one example, the semiconductor layer includes silicon and the photodiodes are formed via ion implantation of dopant material. The p-doped section of the photodiodes may include dopant material such as boron, and the n-doped section of the photodiodes may include dopant material such as phosphorus or arsenic. However, in a different example the semiconductor layer may include a different semiconductor material such as germanium, gallium arsenide, or the like. In this case, the same or other dopant materials may be used to form the photodiodes.

In process block 303, a sacrificial layer (e.g. sacrificial layer 479 of FIGS. 4A-4C) is formed on the semiconductor layer. In one example, the sacrificial layer may include a metal oxide or semiconductor oxide. However, in a different example, the sacrificial layer may include an organic material such as a photoactive polymer or other form of resist.

Process block 305 shows etching trenches in the sacrificial layer and semiconductor layer. These trenches extend through the sacrificial layer and into the semiconductor layer. In one example, etching of the trenches may be achieved via a wet etching process or a dry etching process. One skilled in the art will recognize that both types of etching have their own distinct advantages/disadvantages. Accordingly, depending on the desired etch speed, feature aspect ratio, and/or etch anisotropy, a wet or dry etch may be desired. Additionally, it should be noted that the trenches may form other shapes, not just the rectangular shape depicted. In an alternate example, where the sacrificial layer includes organic materials, etching may involve removing portions of the sacrificial layer with solvent.

Process block 307 illustrates depositing isolation structures (e.g. isolation structures 103) in the trenches. In one example, isolation structures may include metal, metal oxide, semiconductor, semiconductor oxide, semiconductor nitride, or semiconductor oxynitride. These materials may be deposited via thermal evaporation, chemical vapor deposition, atomic layer deposition, molecular beam epitaxy, or the like.

Following deposition of the isolation structures, the sacrificial layer may be polished such that excess material used to form the isolation structures is removed from the surface of the sacrificial layer. After polishing, the isolation structures may be flush with the surface of the sacrificial layer.

In process block 309, the sacrificial layer is removed. This may be achieved via a wet or dry etching process if an inorganic material is used to form the sacrificial layer. However, if an organic material is used to form the sacrificial layer, the sacrificial layer may be removed in a solvent wash.

Process block 311 shows depositing an antireflection coating (e.g. antireflection coating 105) on the semiconductor layer and the isolation structures. In one example, depositing the antireflection coating may include evaporation of an inorganic material such as $MgF_2$. However, in another example, solution processing may be used to deposit other types of materials. One skilled in the relevant art will realize that many materials/structures can be used to form an antireflection coating, and that the examples discussed here are not exclusive.

Process block 313 illustrates an interlayer (e.g. interlayer 107) being formed. The interlayer is formed between the plurality of isolation structures and the plurality of light filters, and the interlayer is shaped to direct light into the plurality of photodiodes. In one example, the directing of light is achieved because the interlayer has an increasing width in a direction toward the semiconductor layer.

In process block 315, a plurality of light filters (e.g. green light filters 131, red light filters 133, and blue light filters 135) is formed between isolation structures. Although not depicted, light filters may also include clear light filters, or infrared light filters.

Process block 317 shows forming a microlens layer (e.g. microlens layer 149) on the plurality of light filters. The microlens layer may be fabricated from a photo-active polymer that is patterned on the surface of the plurality of light filters. Once rectangular blocks of polymer are patterned on the surface of the plurality of light filters, the blocks may be melted (or reflowed) to form the dome-like structure characteristic of microlenses.

FIGS. 4A-4H show an example of a process for forming an image sensor (e.g. image sensor 100), in accordance with the teachings of the present invention. The order in which some or all of the process occurs should not be deemed limiting. Rather, one of ordinary skill in the art having the benefit of the present disclosure will understand that some of the process may be executed in a variety of orders not illustrated, or even in parallel. Additionally, individual figures in FIGS. 4A-4H may correspond to process blocks in process 300.

Figure 4A:
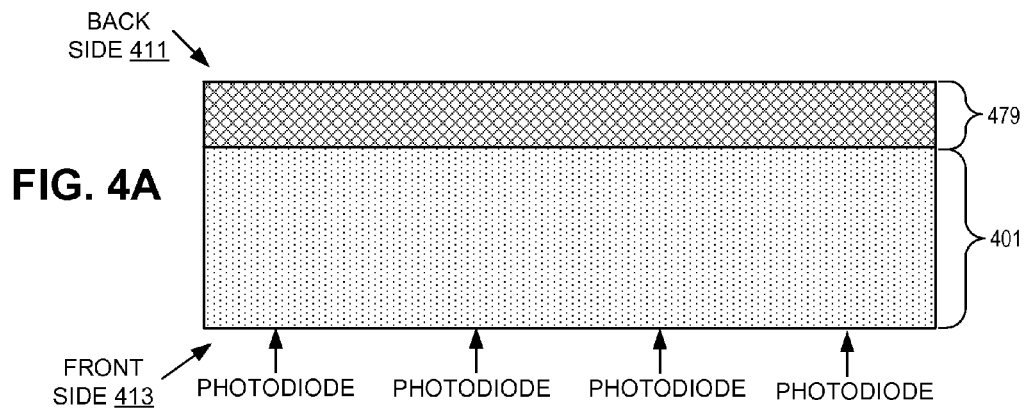
FIGS. 4A-4H show an example of a process for forming an image sensor, in accordance with the teachings of the present invention.

FIG. 4A shows, a plurality of photodiodes formed in a semiconductor layer 401, and semiconductor layer 401 has a front side 413 and a back side 411. Additionally, a sacrificial layer 479 has been deposited proximate to the back side 411 of semiconductor layer 401.

Figure 4B:
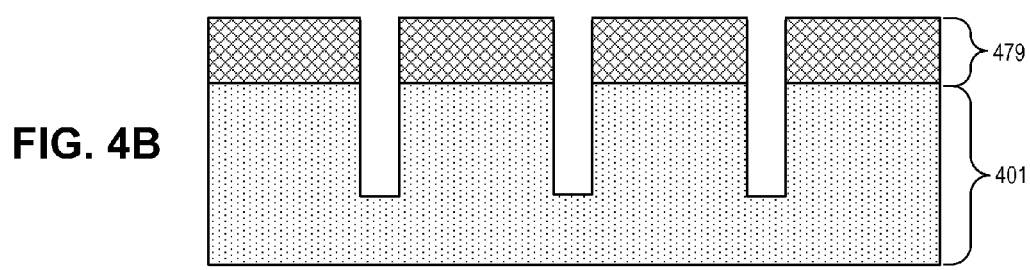

FIG. 4B illustrates etching trenches into sacrificial layer 479 and semiconductor layer 401. Etching of the trenches may be achieved via a wet etching process or a dry etching process. One skilled in the art will recognize that both types of etching have their own distinct advantages/disadvantages. Accordingly, depending on the desired etch speed, feature aspect ratio, and/or etch anisotropy, a wet or dry etch may be desired. Additionally, it should be noted that the trenches may form other shapes, not just the rectangular shape depicted.

Figure 4C:
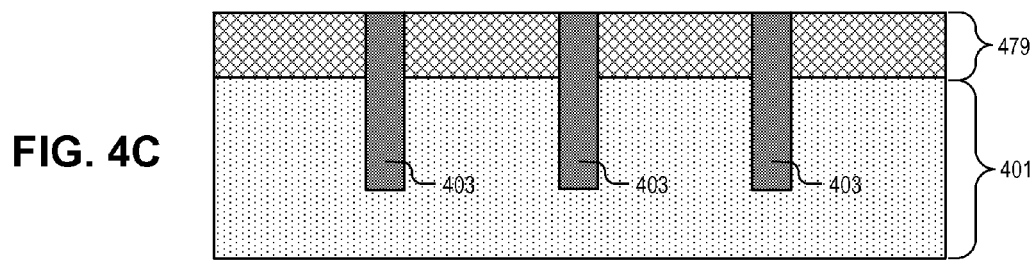

FIG. 4C shows forming a plurality of isolation structures 403 in the back side 411 of semiconductor layer 401 by depositing the plurality of isolation structures 403 in the trenches. Individual isolation structures 403 are disposed between individual photodiodes in the plurality of photodiodes. The isolation structures 403 extend into the back side 411 of semiconductor layer 401 a first depth and extend out of the back side 411 of semiconductor layer 401 a first length.

In one example, forming the plurality of isolation structures 403 may involve thermal evaporation, chemical vapor deposition, atomic layer deposition, or molecular beam epitaxy. Materials used to form the plurality of isolation structures 403 may include metal, metal oxide, semiconductor, semiconductor oxide, semiconductor nitride, or semiconductor oxynitride. However, one skilled in the art having the benefit of the present disclosure will realize that a combination of these materials and other materials not detailed may be used to form the plurality of isolation structures 403.

After deposition, the surface of sacrificial layer 479 may undergo a chemical-mechanical polish to remove excess material and leave the top of the plurality of isolation structures 403 flush with the top of sacrificial layer 479 as illustrated in FIG. 4C.

Figure 4D:
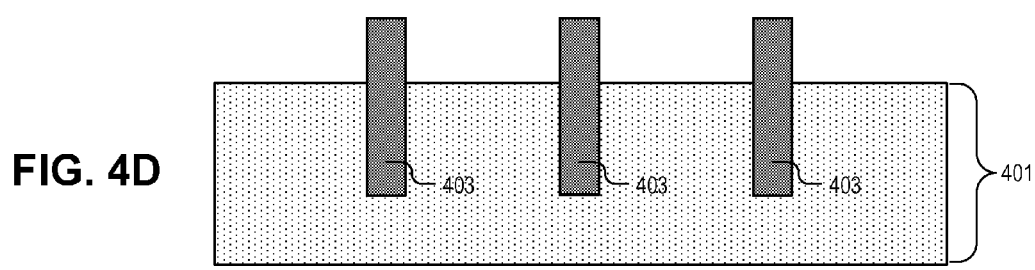

FIG. 4D shows removal of sacrificial layer 479. This may be accomplished via etching sacrificial layer 479, if sacrificial layer 479 is an inorganic material such as an oxide, or the like. However, in another example, if sacrificial layer 479 is an organic material, sacrificial layer 479 may be removed with solvents.

Figure 4E:
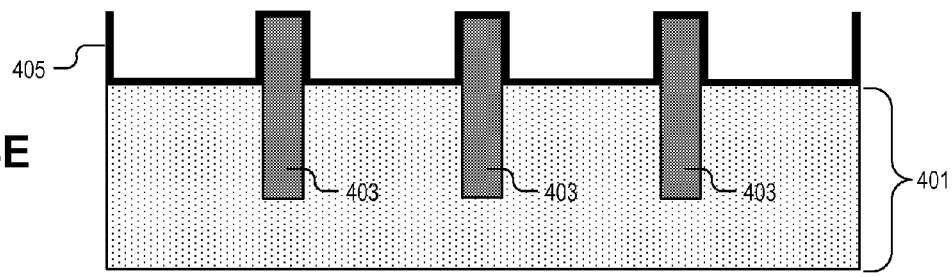

FIG. 4E illustrates depositing an antireflection coating 405 on semiconductor layer 401. In the depicted example, antireflection coating 405 is deposited after forming the plurality of isolation structures 403. However, in a different example, antireflection coating 405 may be deposited before forming the plurality of isolation structures 403.

Figure 4F:
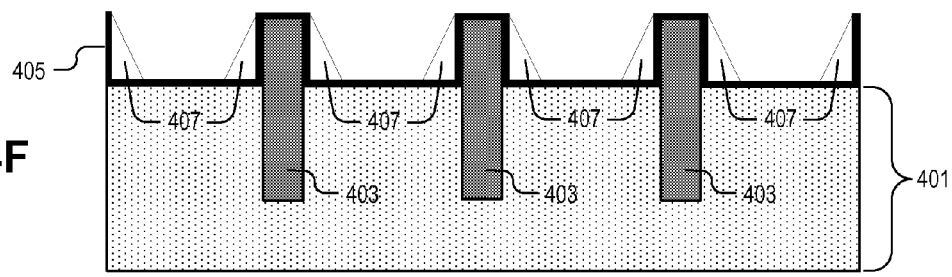

In FIG. 4F, an interlayer 407 is forming between the plurality of isolation structures 403 and the plurality of light filters, and interlayer 407 is shaped to direct light into the plurality of photodiodes. In the depicted example, the directing of light is achieved because interlayer 407 has an increasing width in a direction toward semiconductor layer 401. Thus, light that hits interlayer 407 is reflected into the back side 411 of semiconductor layer 401 and into an individual photodiode in the plurality of photodiodes. However, one skilled in the relevant art will recognize that interlayers of other geometries may be used to achieve the same or similar results.

Figure 4G:
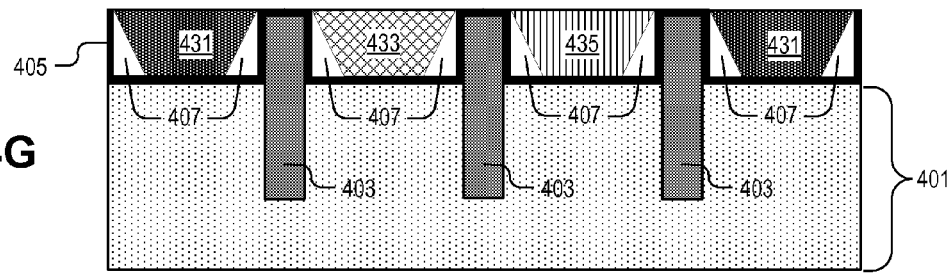

FIG. 4G shows forming a plurality of light filters disposed proximate to the back side 411 of semiconductor layer 401. The plurality of isolation structures 403 is disposed between individual light filters in the plurality of light filters. In one example, the plurality of light filters includes green light filters 431, red light filters 433, and blue light filters 435. However, in a different or the same example, the plurality of light filters may also include clear light filters, infrared light filters, or the like.

Although not depicted, in one example, a light shield layer (e.g. light shield layer 121 of FIG. 1B) may be placed proximate to semiconductor layer 401, such that the light shield layer prevents light incident on the image sensor from reaching underlying logic circuitry. In one example, the light shield layer includes metal and is deposited either before or after the plurality of light filters is formed.

Figure 4H:
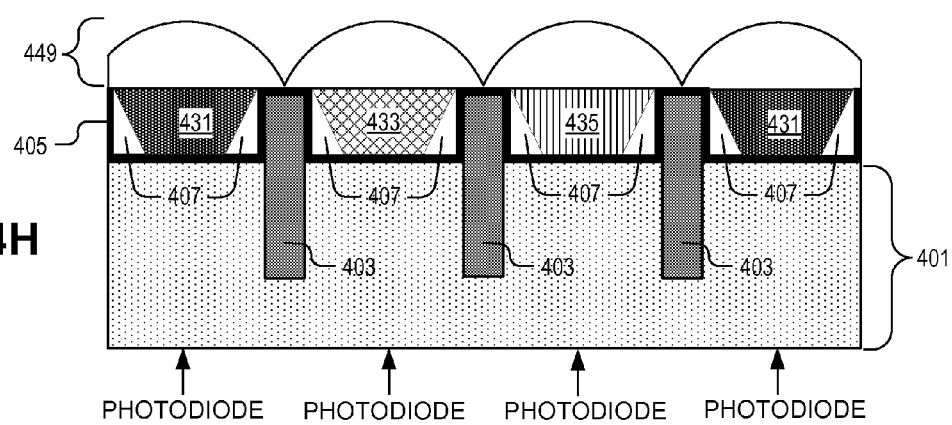

FIG. 4H depicts forming a microlens layer 449 disposed proximate to the plurality of light filters, such that the plurality of light filters is disposed between semiconductor layer 401 and microlens layer 449. Microlens layer 449 may be fabricated from a photo-active polymer that is patterned on the surface of the plurality of light filters. Once rectangular blocks of polymer are patterned on the surface of the plurality of light filters, the blocks may be melted (or reflowed) to form the dome-like structure characteristic of microlenses.

The above description of illustrated examples of the invention, including what is described in the Abstract, is not intended to be exhaustive or to limit the invention to the precise forms disclosed. While specific examples of, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, the image sensor comprising:
   a semiconductor layer including a plurality of photodiodes, wherein the semiconductor layer has a front side and a back side;
   a plurality of isolation structures disposed in the back side of the semiconductor layer between individual photodiodes in the plurality of photodiodes, wherein the plurality of isolation structures extends into the back side of the semiconductor layer a first depth and extends out of the back side of the semiconductor layer a first length;
   a plurality of light filters disposed proximate to the back side of the semiconductor layer, wherein the plurality of isolation structures is disposed between individual light filters in the plurality of light filters; and
   an antireflection coating disposed between the semiconductor layer and the plurality of light filters.

2. The image sensor of claim 1, wherein the antireflection coating is disposed between the plurality of isolation structures and the plurality of light filters.

3. The image sensor of claim 1, wherein the plurality of isolation structures includes at least one of metal, metal oxide, semiconductor, semiconductor oxide, semiconductor nitride, or semiconductor oxynitride.

4. The image sensor of claim 1, further comprising an interlayer disposed between the plurality of isolation structures and the plurality of light filters, wherein the interlayer is shaped to direct light into the plurality of photodiodes.

5. The image sensor of claim 4, wherein the interlayer has an increasing width in a direction toward the semiconductor layer.

6. The image sensor of claim 1, wherein the plurality of light filters includes at least one of red light filters, green light filters, blue light filters, clear light filters, or infrared light filters.

7. The image sensor of claim 1, further comprising a microlens layer disposed proximate to the plurality of light filters, wherein the plurality of light filters is disposed between the semiconductor layer and the microlens layer.

8. An imaging system, the imaging system comprising:
- a semiconductor layer including a plurality of photodiodes, wherein the plurality of photodiodes is arranged into an array, and wherein the semiconductor layer has a front side and a back side;
- a plurality of isolation structures disposed in the back side of the semiconductor layer between individual photodiodes in the plurality of photodiodes, wherein the plurality of isolation structures extends into the back side of the semiconductor layer a first depth and extends out of the back side of the semiconductor layer a first length; and
- a plurality of light filters disposed proximate to the back side of the semiconductor layer, wherein the plurality of isolation structures is disposed between individual light filters in the plurality of light filters.

9. The imaging system of claim 8, further comprising an antireflection coating disposed between the semiconductor layer and the plurality of light filters.

10. The imaging system of claim 8, further comprising control circuitry and readout circuitry, wherein the control circuitry is coupled to control the operation of the plurality of photodiodes and the readout circuitry is coupled to readout image charge from the plurality of photodiodes.

11. The imaging system of claim 10, further comprising function logic coupled to the readout circuitry to manipulate the image charge readout from the plurality of photodiodes.

12. The imaging system of claim 10, further comprising one or more light shield layers disposed to prevent photons incident on the imaging system from reaching the control circuitry and readout circuitry.

13. A method of image sensor fabrication, the method comprising:
- forming a plurality of photodiodes in a semiconductor layer, wherein the semiconductor layer has a front side and a back side;
- forming a plurality of isolation structures in the back side of the semiconductor layer; wherein individual isolation structures in the plurality of isolation structures are disposed between individual photodiodes in the plurality of photodiodes, and wherein the plurality of isolation structures extend into the back side of the semiconductor layer a first depth and extend out of the back side of the semiconductor layer a first length;
- depositing an antireflection coating on the semiconductor layer;
- forming a plurality of light filters disposed proximate to the back side of the semiconductor layer, wherein the plurality of isolation structures is disposed between individual light filters in the plurality of light filters.

14. The method of claim 13, wherein forming the plurality of isolation structures in the back side of the semiconductor layer includes:
- depositing a sacrificial layer disposed proximate to the back side of the semiconductor layer;
- etching trenches into the sacrificial layer and the semiconductor layer;
- depositing the plurality of isolation structures in the trenches; and
- removing the sacrificial layer.

15. The method of claim 13, wherein the plurality of isolation structures includes at least one of metal, metal oxide, semiconductor, semiconductor oxide, semiconductor nitride, or semiconductor oxynitride.

16. The method of claim 13, wherein the antireflection coating is deposited before forming the plurality of isolation structures.

17. The method of claim 13, wherein the antireflection coating is deposited after forming the plurality of isolation structures.

18. The method of claim 13, further comprising forming an interlayer disposed between the plurality of isolation structures and the plurality of light filters, wherein the interlayer is shaped to direct light into the plurality of photodiodes.

19. The method of claim 18, wherein the interlayer has an increasing width in a direction toward the semiconductor layer.

20. The method of claim 13, further comprising forming a microlens layer disposed proximate to the plurality of light filters, wherein the plurality of light filters is disposed between the semiconductor layer and the microlens layer.

21. The method of claim 13, further comprising depositing a light shield layer disposed proximate to the semiconductor layer, wherein the light shield layer prevents light incident on the image sensor from reaching logic circuitry.

* * * * *